(12) United States Patent
Kim et al.

(10) Patent No.: US 6,406,601 B1
(45) Date of Patent: Jun. 18, 2002

(54) METHOD AND APPARATUS FOR COATING ELECTROMAGNETIC WAVE SHIELDING FILMS

(75) Inventors: Do-Gon Kim, Incheon; Eung-Jik Lee, Anyang; Dong-Won Kim, Seongnam; Won-Jong Lee, Daegeon; Youn-Seoung Lee, Seoul, all of (KR)

(73) Assignee: Sunic System, Ltd. (KR)

( * ) Notice: Subject to any disclaimer, the term of this patent is extended or adjusted under 35 U.S.C. 154(b) by 0 days.

(21) Appl. No.: 09/696,168

(22) Filed: Oct. 26, 2000

(30) Foreign Application Priority Data

Mar. 8, 2000 (KR) .............................. 00-11539

(51) Int. Cl.[7] .............................................. C23C 14/34
(52) U.S. Cl. .......................... 204/298.26; 204/298.28; 204/298.12
(58) Field of Search ....................... 204/298.26, 298.28, 204/298.07, 298.15

(56) References Cited

U.S. PATENT DOCUMENTS

| 4,560,462 A | * 12/1985 | Radford et al. ........ 204/298.28 |
| 5,277,778 A | * 1/1994 | Daube et al. .......... 204/298.26 |
| 5,421,979 A | * 6/1995 | Stevenson ............. 204/298.28 |
| 5,688,389 A | * 11/1997 | Bjornard et al. ....... 204/298.07 |
| 5,788,825 A | * 8/1998 | Park et al. ............. 204/298.07 |
| 5,879,519 A | * 3/1999 | Seeser et al. .......... 204/298.26 |
| 5,972,183 A | * 10/1999 | Krueger et al. ........ 204/298.07 |

FOREIGN PATENT DOCUMENTS

| JP | 03 264 667 A | * 11/1991 | .............. 204/298.23 |
| WO | WO-98 08997 A2 | * 3/1998 | .............. 204/298.26 |

OTHER PUBLICATIONS

J.L. Vossen et al. "Thin Film Processes" American Press 1978. pp. 138–141.*

* cited by examiner

Primary Examiner—Nam Nguyen
Assistant Examiner—Gregg Cantelmo
(74) Attorney, Agent, or Firm—Nixon Peabody LLP; Daniel S. Song

(57) ABSTRACT

Disclosed is a method and an apparatus for coating electromagnetic wave shielding films, by which adhesive forces between coating objects and the electromagnetic wave shielding films are strengthened, and the films can be uniformly coated on the coating objects. In the method, surfaces of coating objects are etched, and then electromagnetic wave shielding films are coated on the surfaces of the coating objects. In the apparatus, a cylindrical rotating jig is disposed in a chamber and contains a plurality of coating objects loaded therein. The rotating jig is rotated at a predetermined speed. The rotating jig is put into and drawn out of the chamber. Targets functioning as cathodes are disposed inside and outside of the rotating jig. A controller controls operation of the apparatus.

5 Claims, 20 Drawing Sheets

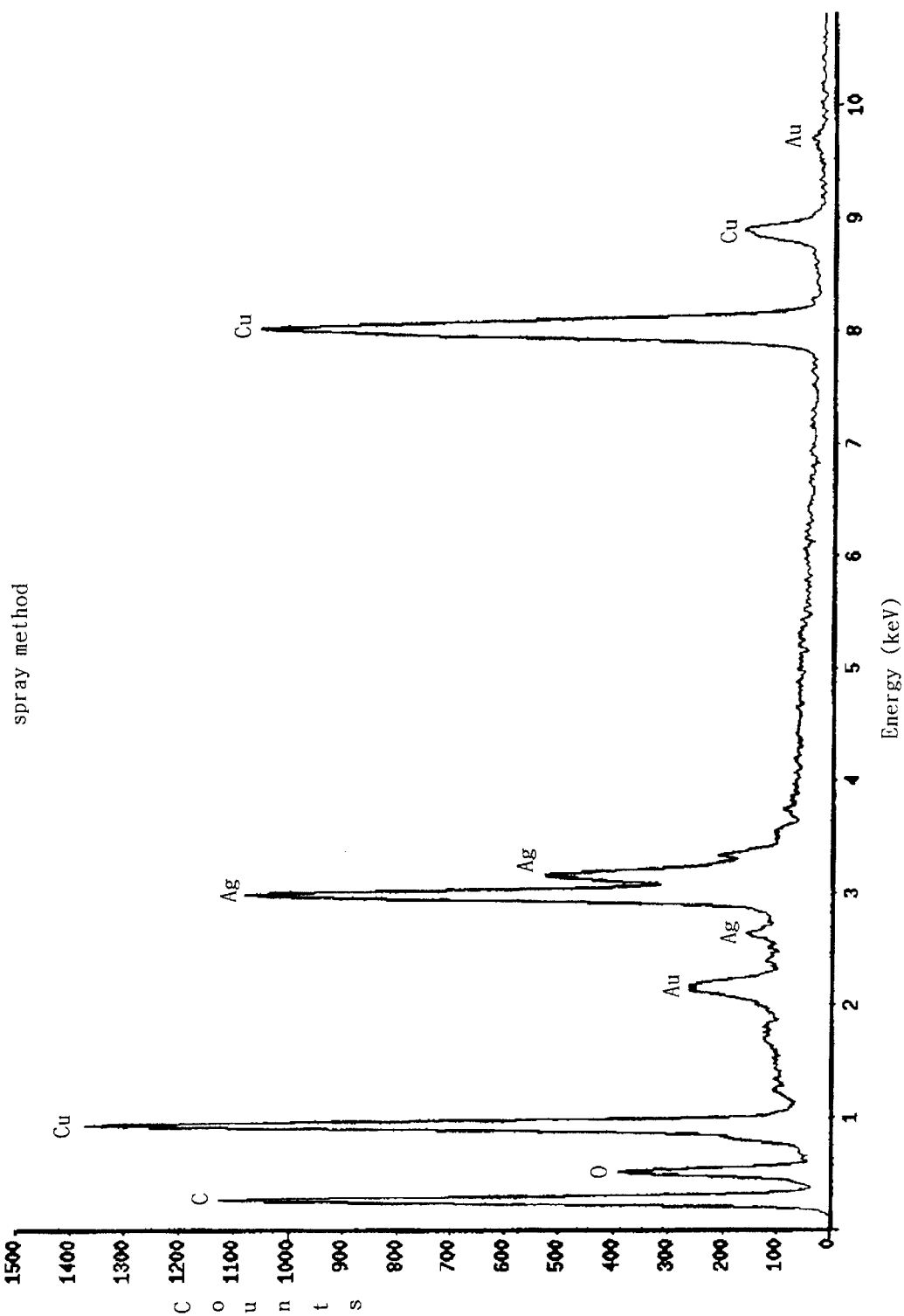

METHOD AND APPARATUS FOR COATING ELECTROMAGNETIC WAVE SHIELDING FILMS

BACKGROUND OF THE INVENTION

1. Field of the Invention

The present invention relates to a method and an apparatus for coating electromagnetic wave shielding films, by which adhesive forces between coating objects and the electromagnetic wave shielding films are strengthened, and the films can be uniformly coated on the coating objects.

2. Description of the Related Art

Nowadays, electromagnetic waves are actively utilized in various fields including an electric field, an electronic field, a communication field, a computer-related medical field, etc., and the fields utilizing the electromagnetic waves show a tendency to greatly increase. Further, according to recent progress in the semiconductor field, digitalization is rapidly progressed in such fields as the fields of home appliances, industrial appliances, and medical appliances, in order to enable the appliances to be miniaturized, to be light, and to have a high reliability. This digitalization also increases the utilization of the electromagnetic waves.

The electromagnetic waves cause various problems, and these problems are more aggravated in these days due to the increased utilization of electromagnetic waves as described above. In more detailed description, the electromagnetic waves can cause video display terminal (VDT) syndrome, abnormal secretion of hormones due to the disturbance of the flow of $Na^+$ and $Ka^+$ ions, cancer, etc., in humans. Moreover, the electromagnetic waves can cause wrong operation of electronic appliances that can be fatal especially in a system such as an airplane. Therefore, there has been an urgent necessity to overcome the above problems by shielding electromagnetic waves.

Among a variety of methods for shielding electromagnetic waves, the most commonly used are a spraying method in which a solution of a shielding metal is spray-coated onto coating objects and a plating method in which coating objects are plated in a plating bath by electroless plating.

However, the used methods as described above have various problems as follows. First, in the spraying method and in the plating method, since the task of forming electromagnetic wave shielding films is performed in the atmosphere, the shielding films coated on the coating objects have a considerably weak adhesion force. Further, the coated thickness of the shielding films and the density of the coated particles are not uniform, which makes the adhesion force be further weakened and sets a limit in improving the shielding effect.

Second, since almost all of the process is manually performed, it is nearly impossible to produce products of the same dimensions and characteristics in mass-production manner.

Third, safety is not guaranteed for workers when the spray task is performed. In addition, a large expense is required for processing sewage created by the industrial water used in the electroless plating.

SUMMARY OF THE INVENTION

Accordingly, the present invention has been made in an effort to solve the problems occurring in the related art, and it is an object of the present invention to provide a method and an apparatus for coating electromagnetic wave shielding films, by which the problems of the prior art as described above are overcome.

It is another object of the present invention to provide a method and an apparatus for coating electromagnetic wave shielding films, by which adhesive forces between coating objects and the electromagnetic wave shielding films are strengthened, and the films can be uniformly coated on the coating objects.

It is another object of the present invention to provide a method and an apparatus for coating electromagnetic wave shielding films, by which products of the same dimensions and characteristic can be produced in a mass-production manner.

It is another object of the present invention to provide a method and an apparatus for coating electromagnetic wave shielding films, by which safety for workers is guaranteed and the labor is performed through dry steps of the process so as to generate no pollution.

In order to achieve the above object, the present invention provides a method for coating electromagnetic wave shielding films, the method comprising the steps of:

loading a plurality of coating objects in a rotating jig having a cylindrical shape; and coating electromagnetic wave shielding films on the coating objects by means of sputtering while rotating the rotating jig.

In accordance with another aspect of the present invention, there is provided a method for coating electromagnetic wave shielding films, the method comprising the steps of:

etching surfaces of coating objects; and coating electromagnetic wave shielding films on the surfaces of the etched coating objects.

In accordance with another aspect of the present invention, there is provided an apparatus for coating electromagnetic wave shielding films, the apparatus comprising:

a cylindrical chamber having a door at a front face of the chamber and a plurality of pumps disposed at both sides of the chamber;

a cylindrical rotating jig disposed in the chamber, the rotating jig having a plurality of coating objects loaded in the rotating jig;

means for rotating the rotating jig at a predetermined speed, said rotating means being disposed at a back side of the rotating jig;

means for moving the rotating jig to be put into and drawn out of the chamber so as to load and unload the coating objects in and out of the rotating jig, said moving means being disposed under the rotating jig;

targets disposed inside and outside of the rotating jig, the targets functioning as cathodes; and a controller for controlling operation of the apparatus, the controller being disposed at one side of the chamber.

BRIEF DESCRIPTION OF THE DRAWINGS

The above objects, and other features and advantages of the present invention will become more apparent after a reading of the following detailed description when taken in conjunction with the drawings, in which:

FIGS. 17a and 17b are graphs for showing the analyses of the constituents by an energy dispersive X-ray spectrometer (EDS), respectively of the conventional electromagnetic wave shielding film and the electromagnetic wave shielding film of the present invention;

DETAILED DESCRIPTION OF PREFERRED EMBODIMENTS

Figure 1:
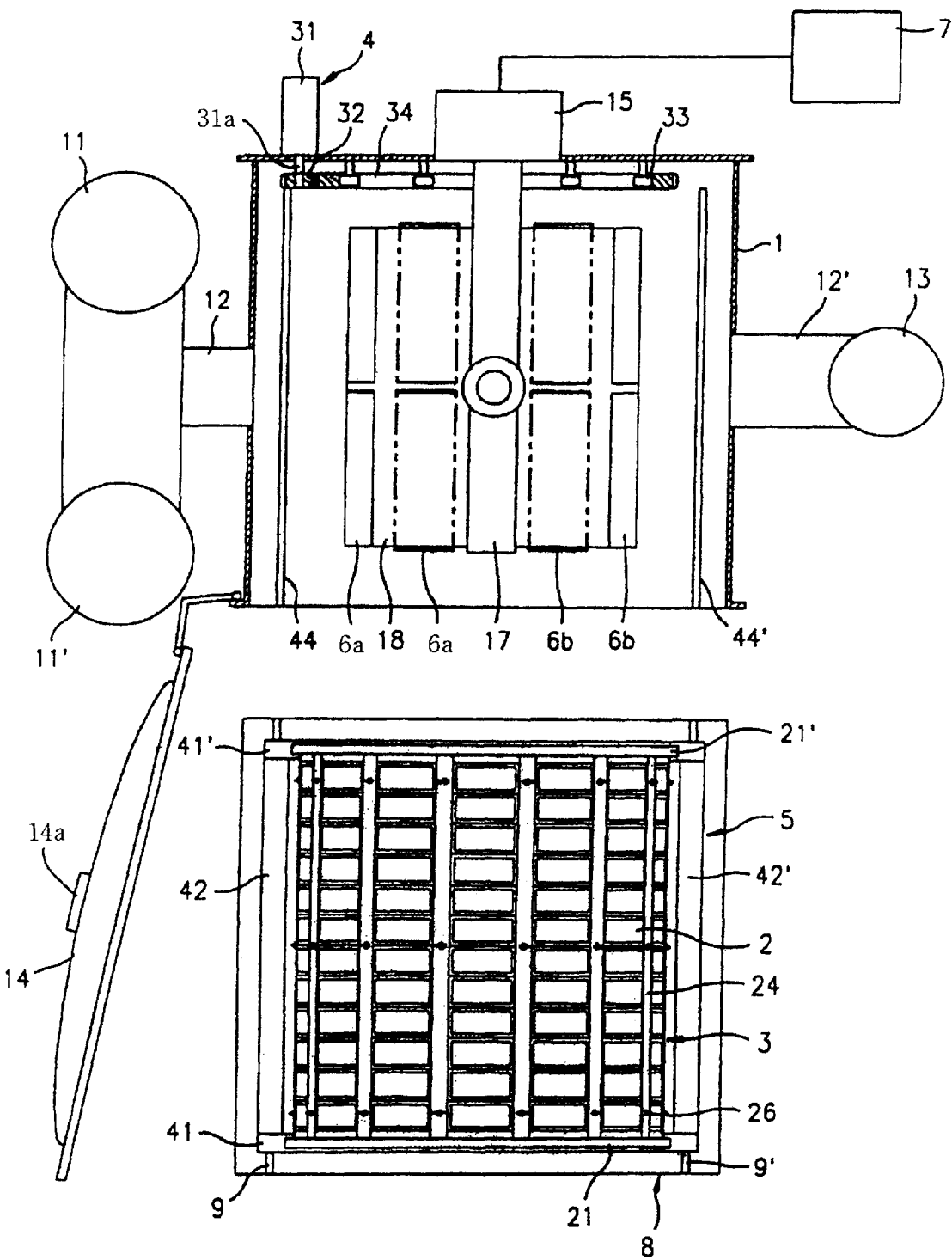
FIG. 1 is an exploded sectional view of an apparatus for coating electromagnetic wave shielding films according to the present invention.
Figure 2:
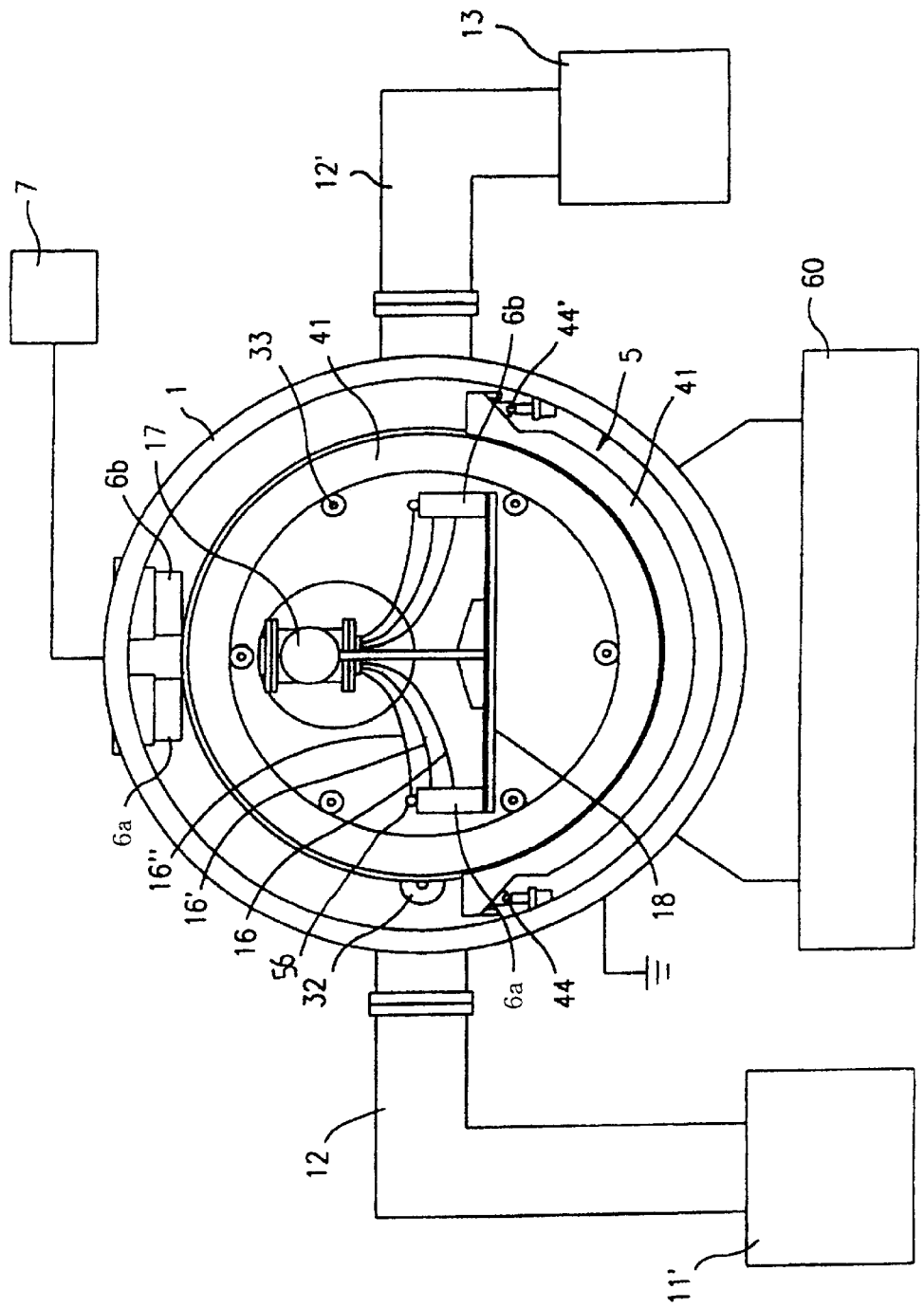
FIG. 2 is a front view of the apparatus as shown in FIG. 1, in the state that the door is eliminated.
Figure 3:
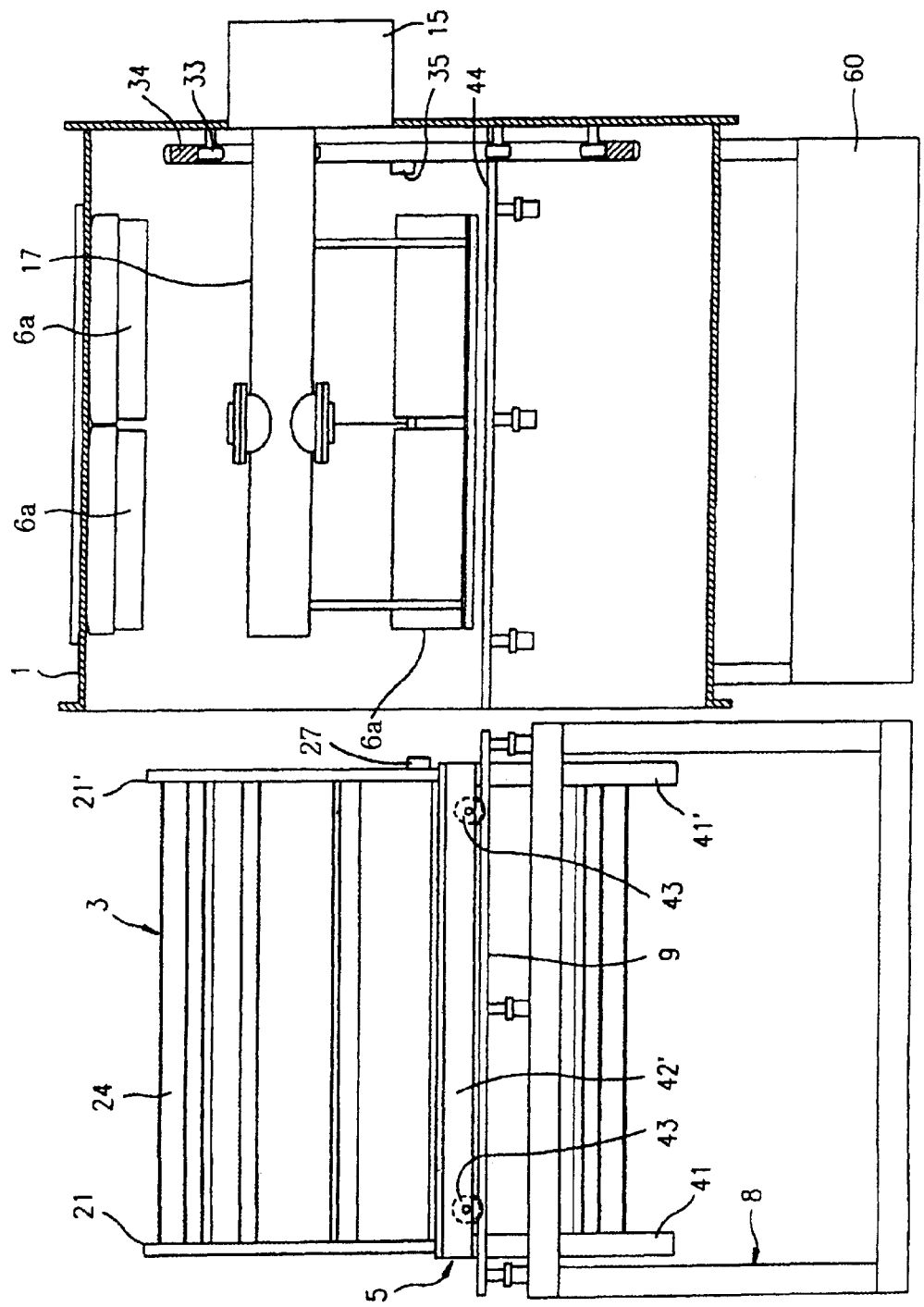
FIG. 3 is a sectional view of the apparatus as shown in FIG. 1, in the state that the rotating jig is drawn out of the chamber.
Figure 4:
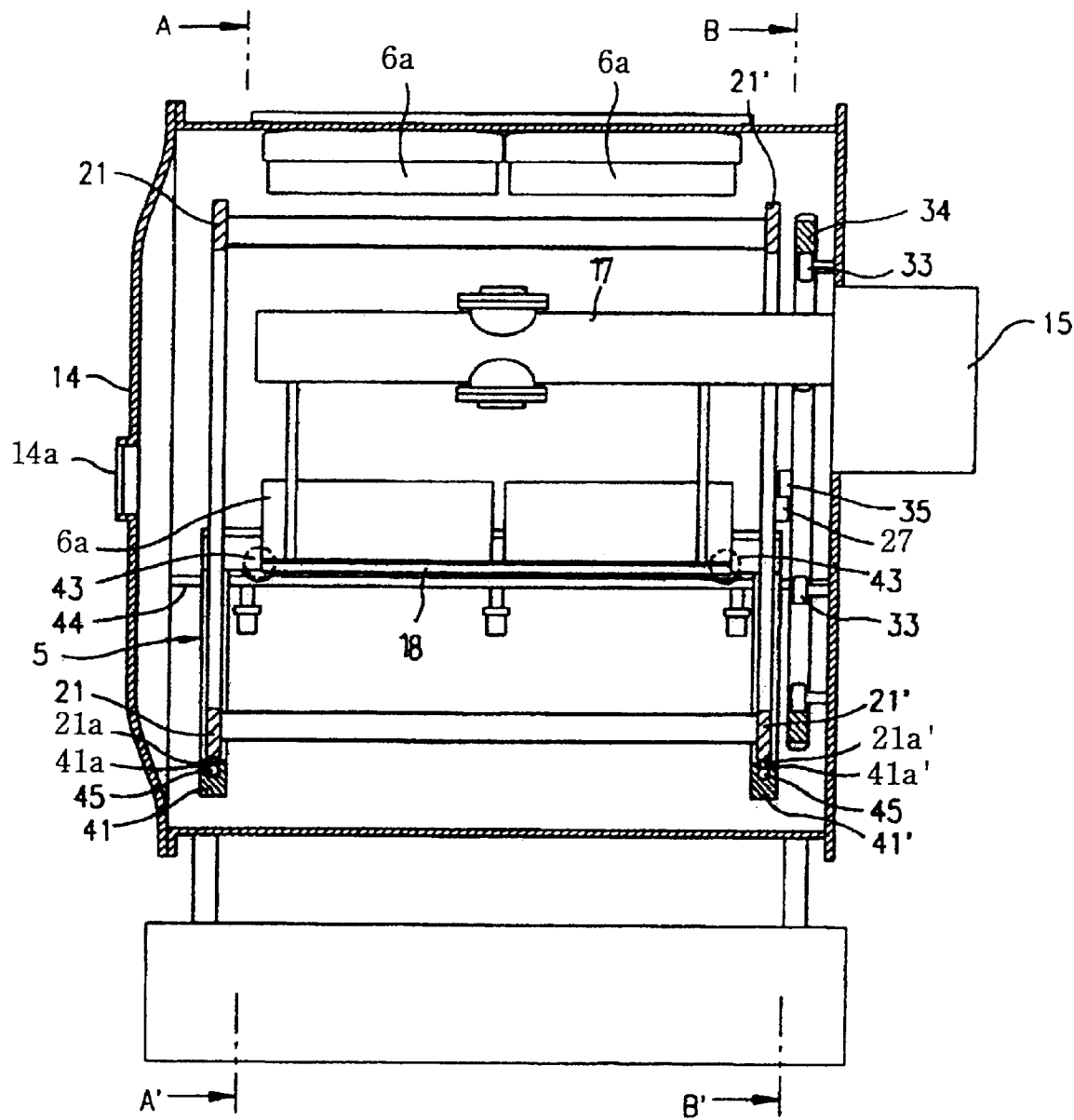
FIG. 4 is a sectional view of the apparatus as shown in FIG. 1, in the state that the rotating jig is inserted in the chamber.
Figure 5:
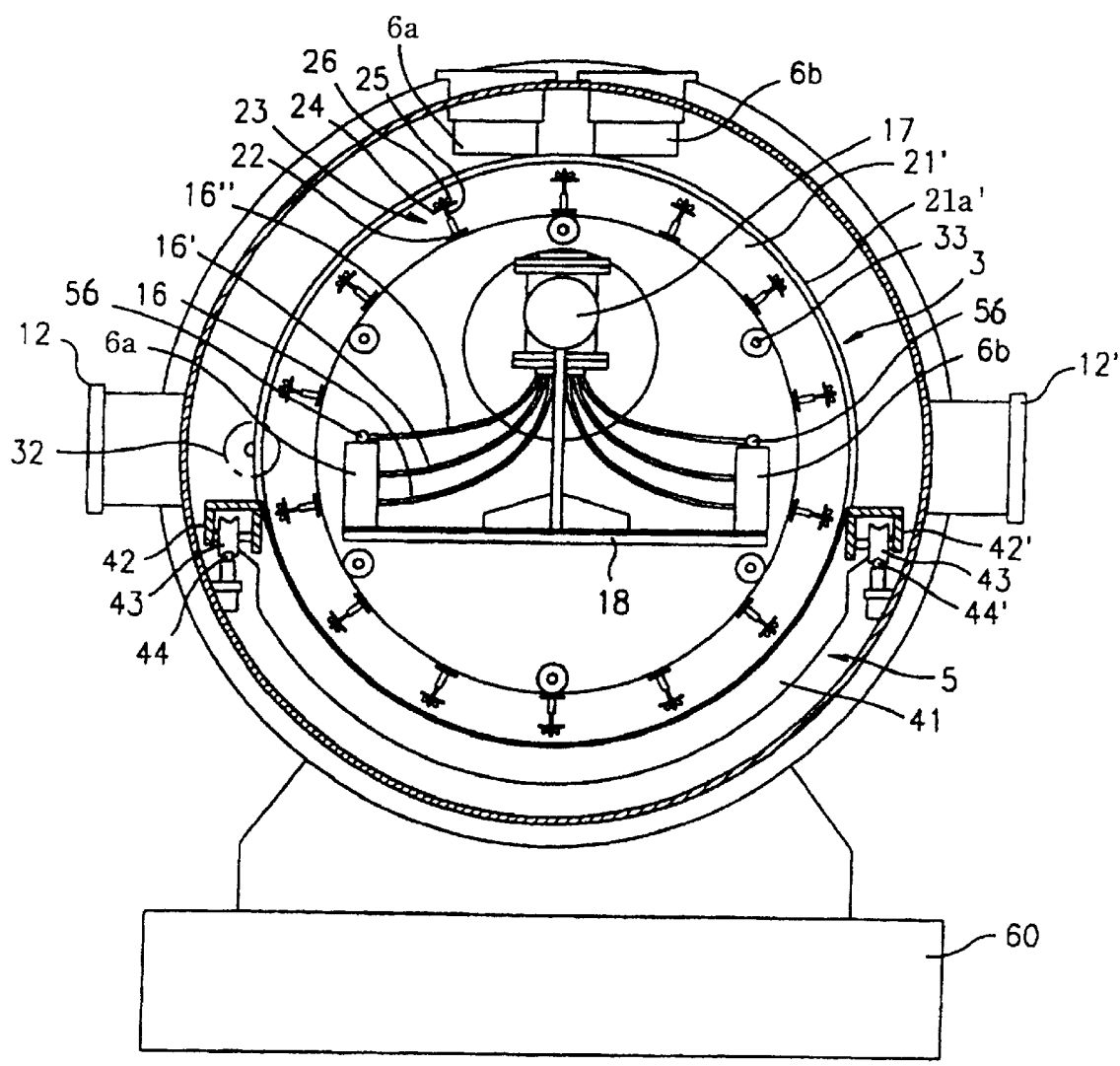
FIG. 5 is a sectional view taken along line A–A' in FIG. 4.
Figure 6:
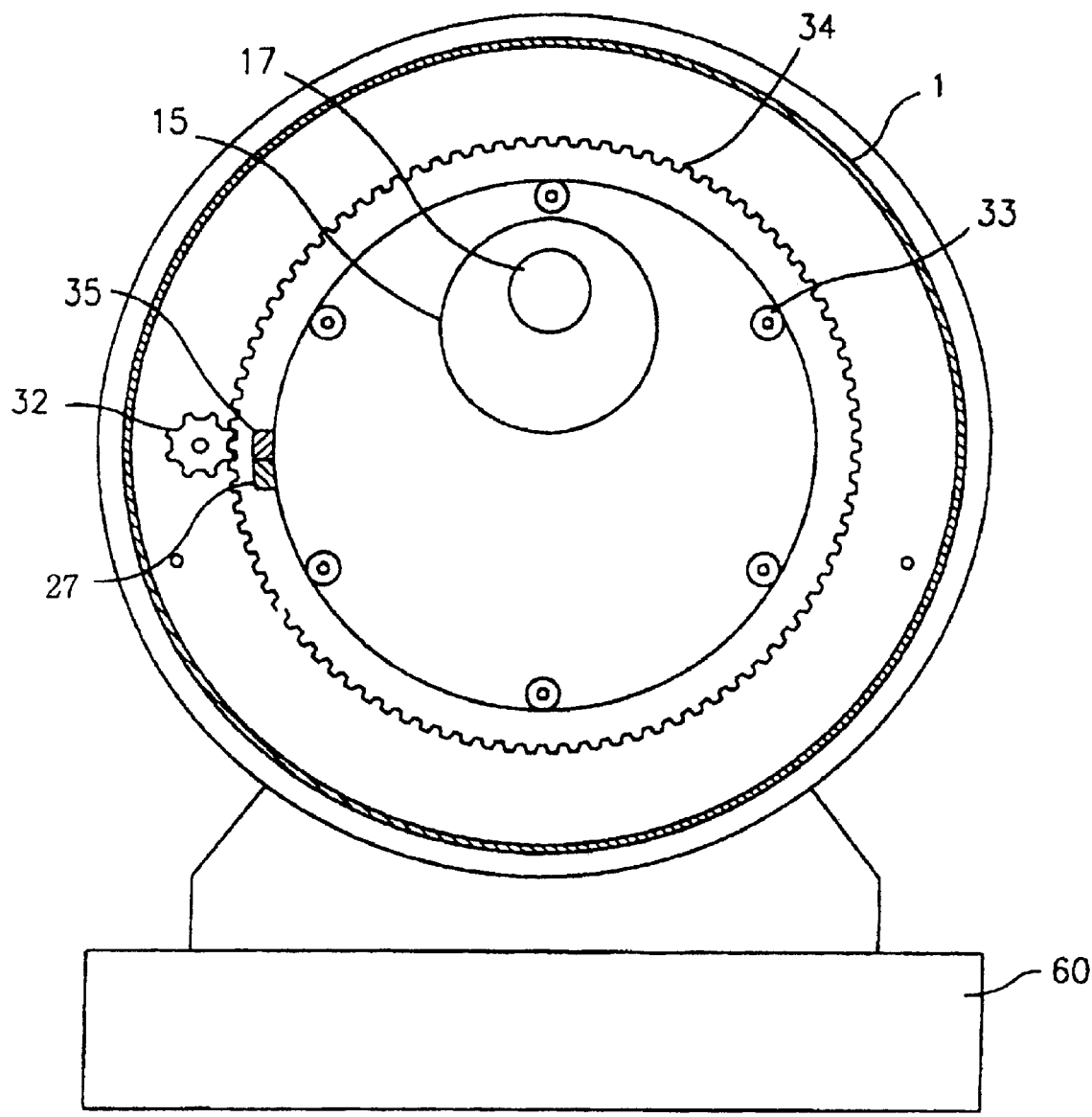
FIG. 6 is a sectional view taken along line B–B' in FIG. 4.
Figure 7:
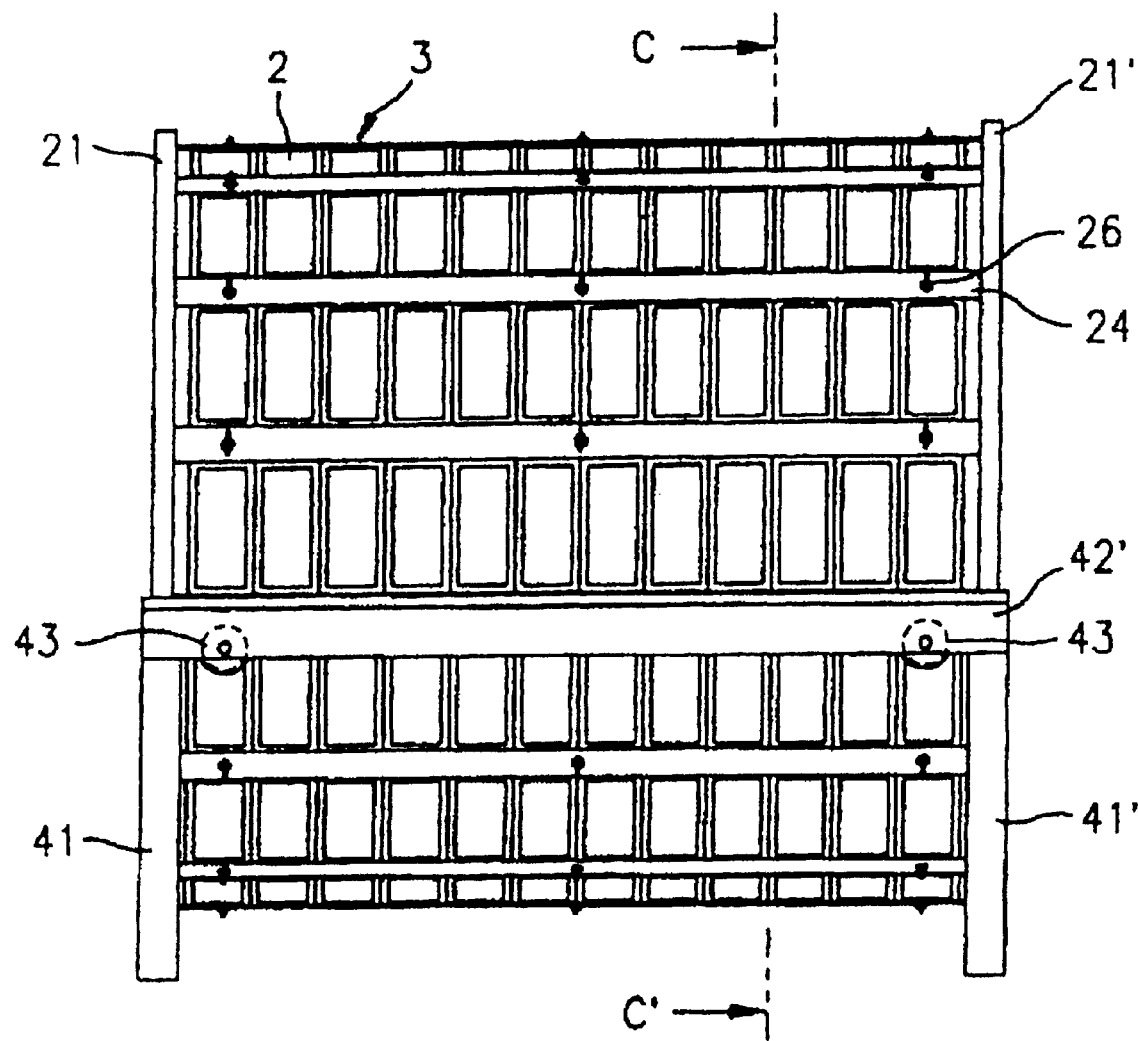
FIG. 7 is a front view of a rotating jig of the apparatus shown in FIG. 1.
Figure 8:
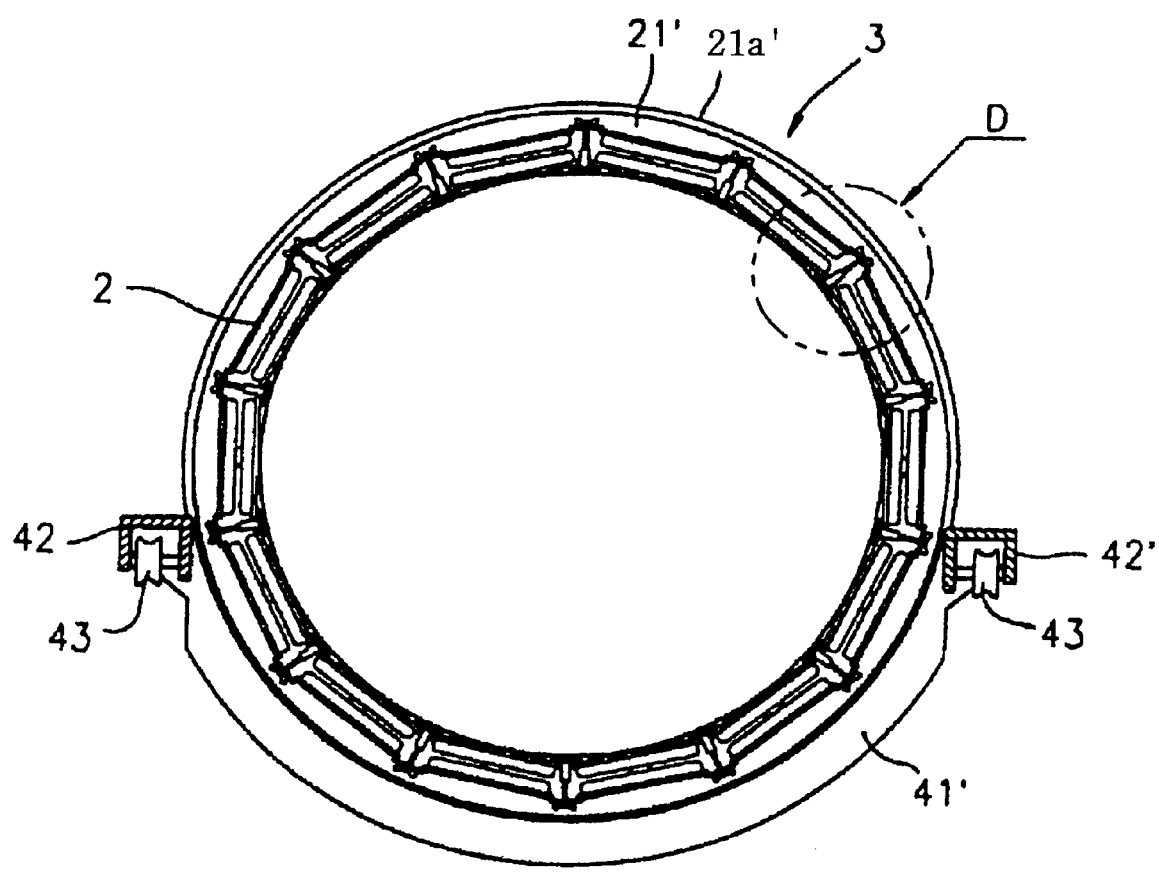
FIG. 8 is a sectional view taken along line C–C' in FIG. 7.
Figure 9:
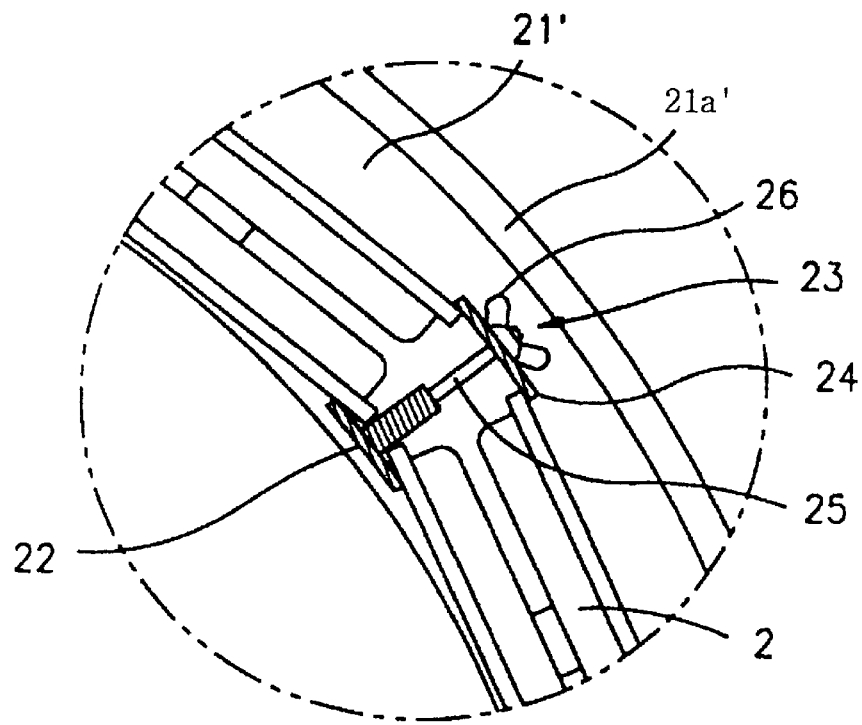
FIG. 9 is an enlarged sectional view of a circled portion D in FIG. 8.
Figure 10:
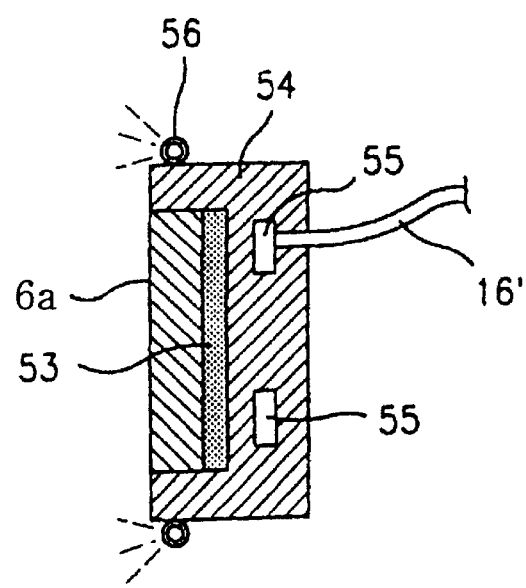
FIG. 10 is a sectional view for showing the construction of a target.

The above and other objects, characteristics, and advantages of the present invention will become apparent from the following description with reference to the accompanying drawings.

Referring to FIGS. 1 to 10, an apparatus for coating electromagnetic wave shielding films according to the present invention includes a cylindrical chamber 1, a rotating jig 3 disposed in the chamber 1, a jig rotating means 4, a jig moving means 5, a plurality of targets 6, 6a, and 6b, a controller 7 for supplying electric power, and a jig carrying stand 8. In the apparatus, the rotating jig 3 has a shape of a cylinder in which a plurality of coating objects 2 are disposed. The rotating jig 3 electrically functions as an anode. The jig rotating means 4 is disposed behind the rotating jig 3 and has a function of rotating the rotating jig 3 at a constant speed. The jig moving means 5 is disposed under the rotating jig 3 and has a function of putting the rotating jig 3 in and drawing the rotating jig 3 out of the chamber 1. The targets 6, 6a, and 6b are disposed in the chamber 1 and electrically function as cathodes. The controller 7 is disposed outside of the chamber to control the operation of the apparatus. The jig-carrying stand 8 is disposed outside of the chamber 1, and the rotating jig 3 is put on the jig-carrying stand 8.

The chamber 1 is connected through an exhaust line 12 to two diffusion pumps 11 and 11' disposed at one side of the chamber 1, and is connected through an exhaust line 12' to a cryopump 13. A door 14 having a viewport 14a is assembled at the front face of the chamber 1, and an outer protection tube 15 is provided at the rear face of the chamber 1. An inner protection tube 17 protruding inward of the chamber 1 is disposed in the outer protection tube 15. The inner protection tube 17 protects an electric power line 16, a cooling water line 16', and a gas line 16", which extend into the chamber 1. In the chamber 1, the inner protection tube 17 is connected to a target supporter 18 disposed under the inner protection tube 17.

The rotating jig 3 has a shape of a circular ring, and includes a pair of fixing plates 21 and 21', a plurality of fixing members 22 disposed between the fixing plates 21 and 21', and a plurality of clamping means 23 for fixing the coating objects 2. The clamping means 23 are disposed outside of the fixing members 22, and are spaced at regular intervals.

Each of the clamping means 23 includes a moving clamp 24, a bolt 25 extending through each of the fixing members 22 and the moving clamp 24, and a tightening screw 26 assembled with the bolt 25 so as to tighten or loosen the moving clamp 24.

The jig rotating means 4 includes a motor 31 disposed outside of the back of the chamber 1, a driving gear 32 rotatably disposed in the chamber 1 and connected to a motor shaft 31a of the motor 31, and a driven gear 34 engaged with the driving gear 32. The driven gear 34 has a shape of an annulus whose inner circumference is supported by supporting rollers 33.

A driving-side protuberance 35 is disposed at a portion of the driven gear 34, and a jig-side protuberance 27 is disposed at the fixing plate 21' of the rotating jig 3 so as to be engaged with the driving-side protuberance 35 when the driven gear 34 rotates.

The jig moving means 5 includes a pair of semicircular jig supporters 41 and 41' disposed at a lower portion of the rotating jig 3 and being spaced from each other, a pair of crossbeams 42 and 42' connecting the jig supporters 41 and 41', a plurality of rollers 43 disposed with predetermined intervals apart at the crossbeams 42 and 42', and a pair of rails 44 and 44' disposed at both sides in the chamber 1, along which the rollers 43 can roll.

At upper surfaces of the jig supporters 41 and 41' are respectively formed separation preventing recesses 41a and 41a' in which bearings 45 are disposed. Guiding protuberances 21a and 21a' are formed on the outer peripheral surfaces of the fixing plates 21 and 21' of the rotating jig 3, and are inserted in the separation preventing recesses 41a and 41a', so as to prevent the rotating jig 3 from being separated from the jig moving means 5 when rotating.

Two copper targets 6a and two stainless steel targets 6b are disposed on an upper portion in the chamber 1 and at the target supporter 18 and are spaced from each other so as to insulate the chamber 1 by means of insulating material (not shown). The targets 6a and 6b disposed at the upper portion in the chamber 1 is disposed in such a manner as to be oriented toward the center of the interior of the chamber 1, while the targets 6a and 6b disposed at the target supporter 18 are disposed in such a manner as to be oriented toward the inner peripheral surface of the chamber 1.

At the rear surfaces of the targets 6a and 6b are arranged a plurality of bar magnets 53. In a holder 54 for fixing the targets 6a and 6b and the bar magnets 53 are formed cooling water circulating holes 55. Outside of the holder 54 is disposed a gas line 56 at which a plurality of gas injecting holes (not shown) are formed.

The cooling water circulating holes 55 are connected to the cooling water line 16' introduced into the inner protection tube 17, so that the cooling water can circulate through the targets 6a and 6b to cool them.

The jig carrying stand 8 is an auxiliary means for supporting the rotating jig 3 when the rotating jig 3 is drawn out of the chamber 1. The jig-carrying stand 8 includes a pair of rails 9 and 9' at both sides thereof, so that the rollers 43 disposed at the rotating jig 3 can roll on the rails 9 and 9'.

The reference numeral 60 not described above designates a chamber supporter for supporting the chamber 1.

Hereinafter, described will be a method for coating electromagnetic wave shielding films by means of the apparatus as described above.

Material for the coating object 2 is made by injection-molding polycarbonate that is usually used as a material for a casing of a cellular phone in recent times.

1. Step of Inspecting the Injection Molding Object and Ultrasonic Cleaning

As a previous step before processing the coating object, the coating object is inspected by the naked eye for parting powders, fingerprints, dust, and organic material, which may be generated during the injection molding and can have a bad effect on coating. Thereafter, the coating object is subjected to an ultrasonic cleaning in an ultrasonic cleaner.

2. Step of Hot-wind Drying in an Oven

After the ultrasonic cleaning, the coating object is put into an oven. Then, sufficiently eliminated is gas that may be generated on the surface of the coating object, within the limit that the coating object is not damaged by the heat. Accordingly, reduced is a pressure decrease in an initial stage that may happen in the case of mass-production, and thereby the manufacturing time is reduced and the profitability is increased.

3. Plasma Etching Step

The coating object is inserted in a chamber of an etching apparatus. Then, a plasma etching is performed while oxygen gas $O_2$ of about 20 to 50 sccm is injected into the chamber for about 10 to 30 minutes by applying an electric power of about 100 to 150 watts, where the degree of vacuum in the chamber is maintained about 30 to 60 Torr.

4. Coating Object Loading Step

In this step, the coating object 2 etched as described above is loaded in an apparatus for coating electromagnetic wave shielding films according to the present invention. That is, the door 14 of the chamber 1 is opened, and then the jig supporters 41 and 41' and the rotating jig 3 are drawn out from the interior of the chamber 1, so that the jig supporters 41 and 41' and the rotating jig 3 are located on the jig carrying stand 8.

Thereafter, the tightening screws 26 are loosened from the rotating jig 3. Then, in the state that the moving clamp 24 is loosened, one side of the coating object 2 is inserted between the moving clamp 24 and the fixing member 22 and the other side of the coating object 2 is inserted between another moving clamp 24 and another fixing member 22 adjacent to the above ones. In this state, the tightening screw 26 is tightened to fix the coating object 2. In this way, a plurality of the coating objects are disposed in two rows in the cylindrical rotating jig 3, so that the coating surfaces are oriented outward.

Thereafter, the rotating jig 3 in which the coating objects 2 are loaded is pushed into the chamber 1. In this case, the rollers 43 provided at the crossbeams 42 and 42' roll on the rails 44 and 44', so that the rotating jig 3 together with the jig supporters 41 and 41' is inserted in the chamber 1. Then, the door 14 is closed.

5. Copper Film Coating Step

After the coating objects 2 are loaded in the chamber 1, the degree of vacuum in the chamber 1 is maintained $10^{-5}$ mbar through a pumping by means of diffusion pumps 11 and 11', and argon gas of 10 to 20 sccm is injected through the gas line 56 into the chamber 1. Thereafter, the motor 31 is rotated, so that the driving-side protuberance 35 of the driven gear 34 is engaged with the jig-side protuberance 26 formed at the fixing plate 21' of the rotating jig 3. Then, the rotating jig 3 rotates also. In the state that the rotating jig 3 containing the coating objects 2 rotates as described above, the controller 7 applies an electric power of 300 to 600 volts and five to ten ampere to the copper target 6a for five to ten seconds, so as to free-sputter the copper target 6a. Then, a copper film is coated on the coating objects 2 by means of sputtering by plasma while the degree of vacuum is maintained at $10^{-2}$ to $10^{-4}$ mbar.

6. Stainless Steel Film Coating Step

After performing the copper film coating task for a predetermined time, a DC electric voltage of 400 to 700 volts and five to ten ampere is applied to the stainless steel target 6b, and stainless steel film is coated around the copper film by a plasma sputtering while an argon gas of 20 to 50 sccm is injected in the chamber 1. The stainless steel film coated as described above prevents the copper film from being oxidized or worn away.

Figure 11:
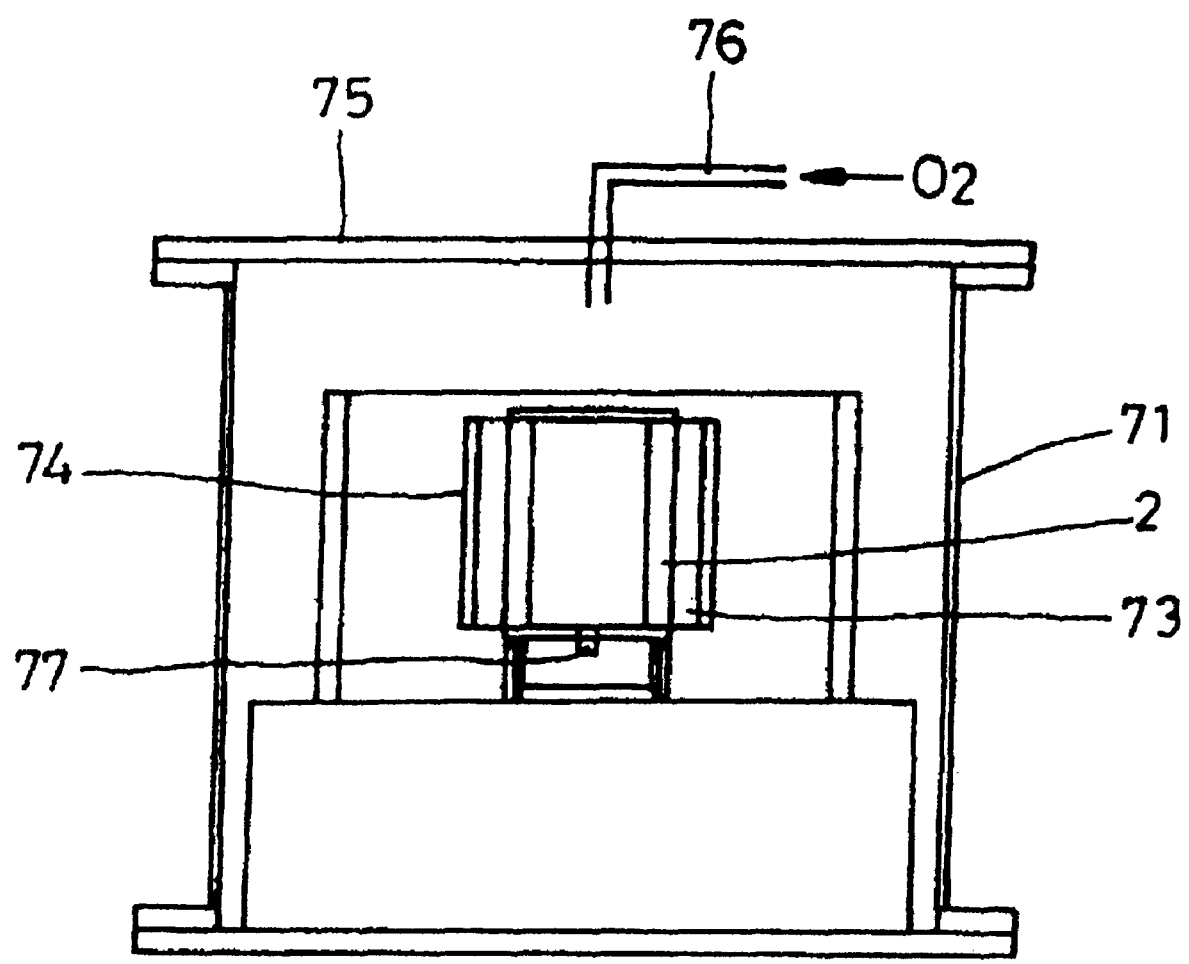
FIG. 11 is a schematic sectional view of an apparatus for oxygen plasma etching according to the present invention.

Referring to FIG. 11 showing an embodiment of a plasma etching apparatus used in the coating task as described above, a holder 73 for containing the coating objects 2 is disposed in a chamber 71, a grounding electrode 74 surrounds the holder 73. Electric power is applied to a radio frequency (RF) electrode 77 mounted to the holder 73 while $O_2$ gas is injected into the chamber 71 through a gas-introducing hole 76 provided at the cover 75, so that the surfaces of the coating objects 2 are uniformly etched by the oxygen plasma, and thereby the conductive coating object has an increased adhesion force.

In the case where the coating objects 2 are etched in the plasma etching apparatus as described above, the adhesion force between the coating object and the copper film is increased, and the reason of such an increase is as follows.

Figure 12A:
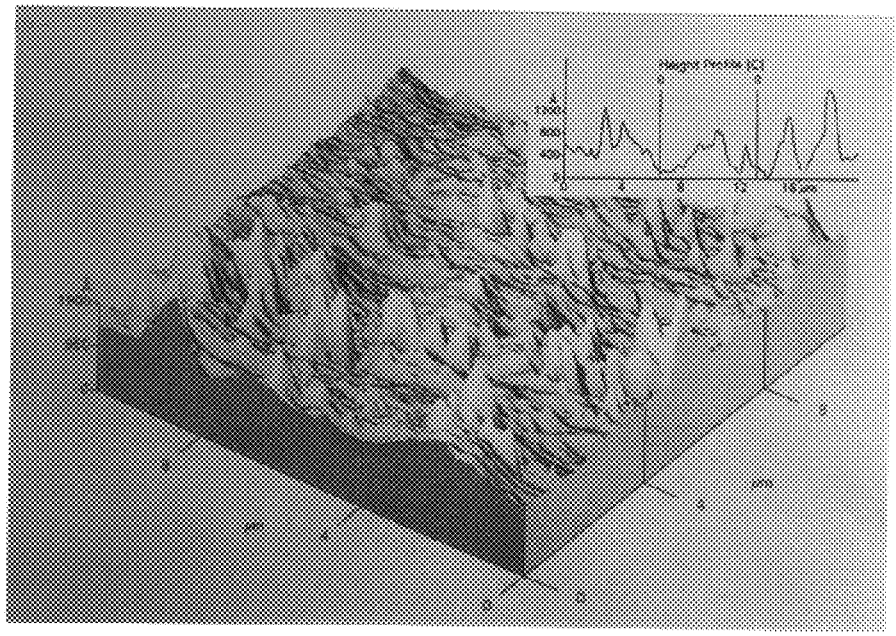
FIGS. 12a and 12b are photographs for comparing the atomic force microscopy (AFM) characteristics of the surface states, respectively before and after the coating object is etched, with each other.
Figure 12B:
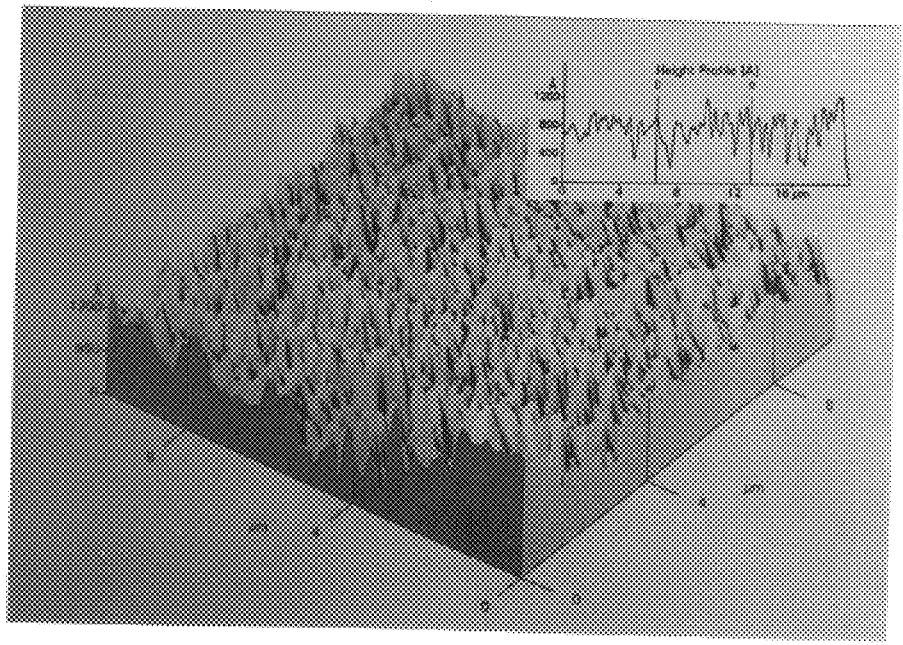

FIGS. 12a and 12b are photographs for comparing the atomic force microscopy (AFM) characteristics of the surface states, respectively before and after the coating object is etched, with each other. In this case, the coating object is made by injection-molding polycarbonate that is usually used as a material for a casing of a cellular phone in recent times. As apparent from the photographs, by the oxygen plasma etching, alien substances adhered to the surfaces of the coating objects are eliminated and the surface area of the coating objects is increased, so that the adhesion force for sucking the copper film is increased when the copper film is coated.

That is, as shown in the photographs, after the etching is performed, the roughness of the surface is increased so that the adhesion force of the surface is increased. In addition, since the area that comes into contact with the copper film is increased, the copper film can be strongly anchored when it is coated.

Figure 13:
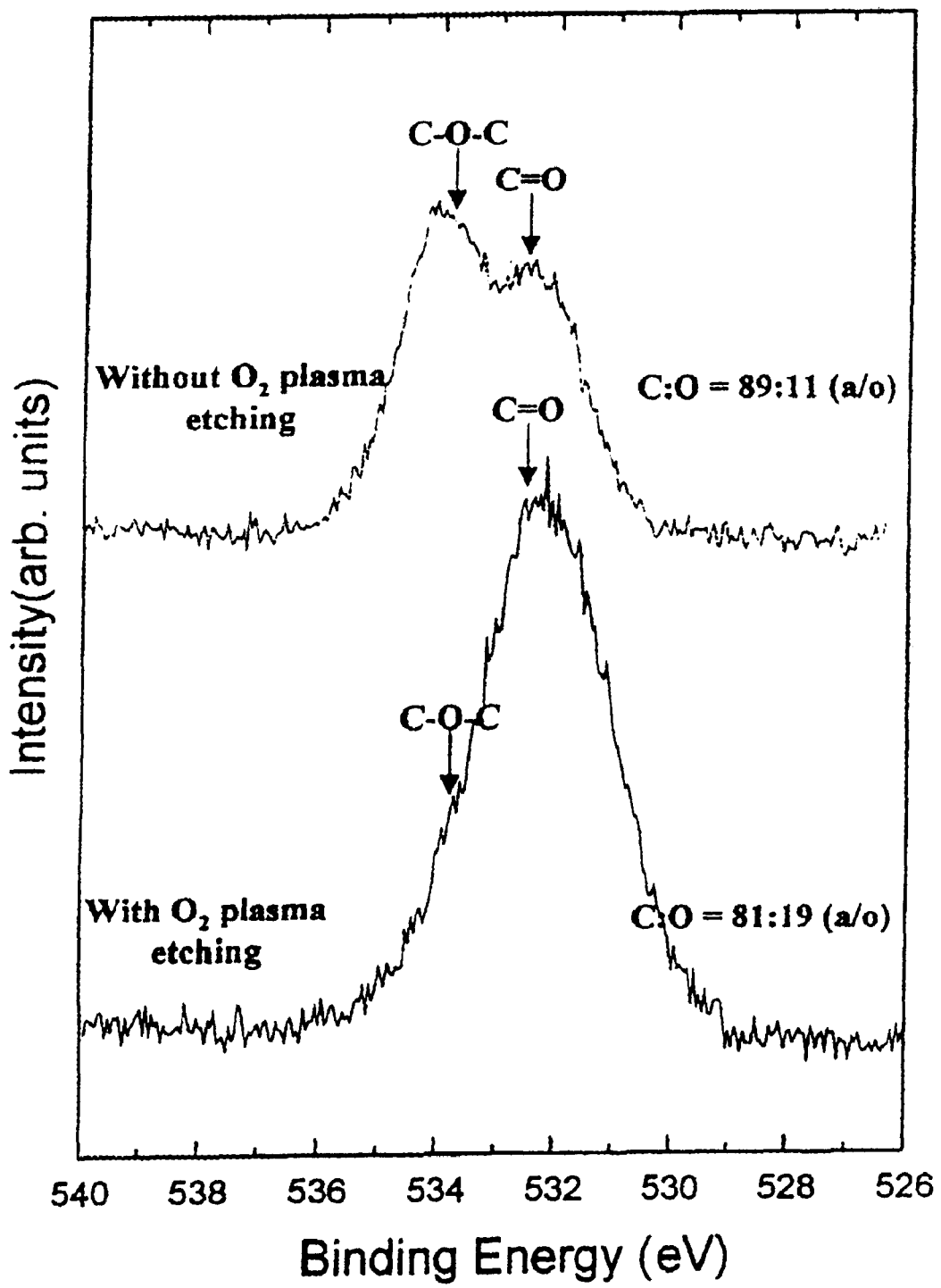
FIG. 13 is a graph for comparatively showing spectrums by an X-ray Photoelectron Spectroscopy (XPS), respectively when the coating object is etched and not etched.

FIG. 13 shows a graph for comparatively showing spectrums by an X-ray Photoelectron Spectroscopy (XPS), by which can be compared with each other the surface adhesion energies respectively when the coating object is etched and not etched. As apparent from the graph, when the oxygen plasma etching treatment is performed, the atomic weight of the oxygen is increased about double in comparison with the original coating object. Moreover, bonds of C—O—C, which are the form of the bonds between carbon and oxygen in the polycarbonate, are decreased while bonds of C=O are increased. Due to the change of forms of the bonds as described above, a thin film of copper-oxygen-carbon compound and a copper oxide film are formed at an interface between the coating object and the coating material to precipitate the interface reaction and thereby increase the adhesion force.

Figure 14:
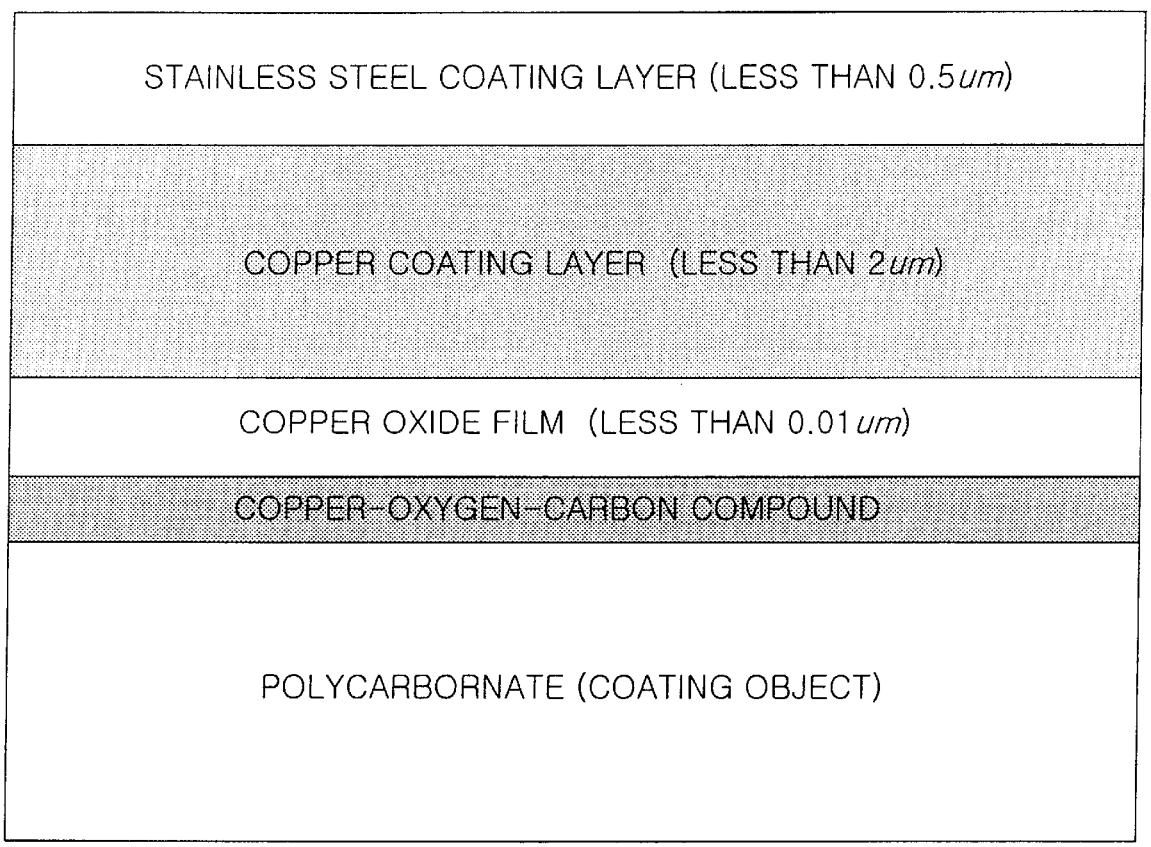
FIG. 14 is a sectional view in a state where the coating objects made from polycarbonate are coated after being etched.

FIG. 14 shows a section in a state where the coating objects made from polycarbonate are coated after being etched. As shown, the surface of the coating object of polycarbonate is changed and copper-oxygen-carbon compound and copper oxide are formed at the interface to thereby increase the adhesion force. Further, stainless steel film having a good adhesion force to the copper film is coated on the copper film having a good conductive characteristic and thereby having a good electromagnetic wave shielding characteristic. Therefore, the coated films have a good adhesion force therebetween and a superior electromagnetic wave shielding characteristic, despite that they have a thickness not more than several micrometers.

Figure 15A:
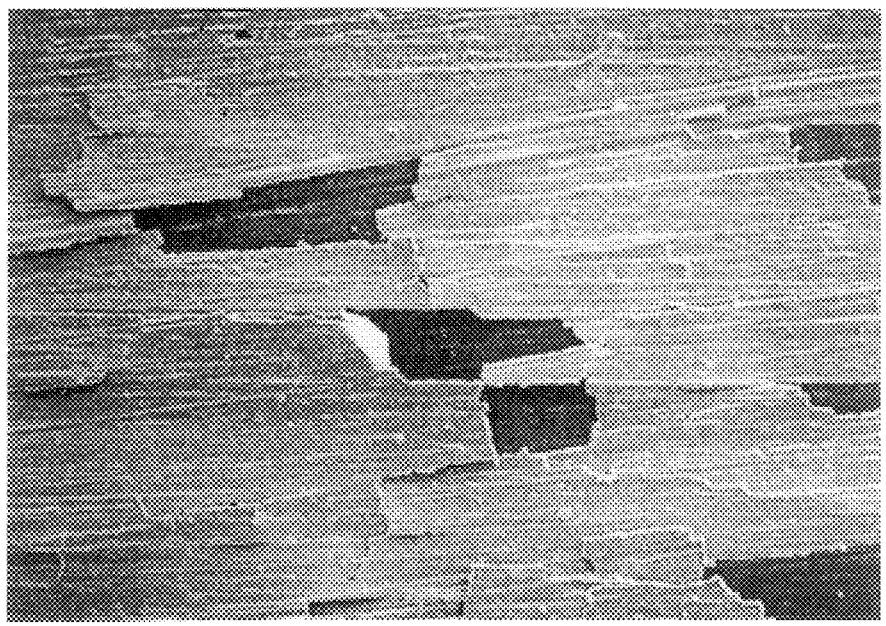
FIGS. 15a and 15b are pictures taken by a scanning electron microscope, of test pieces respectively after and before the plasma etching is performed, after copper films are coated on the test pieces.
Figure 15B:
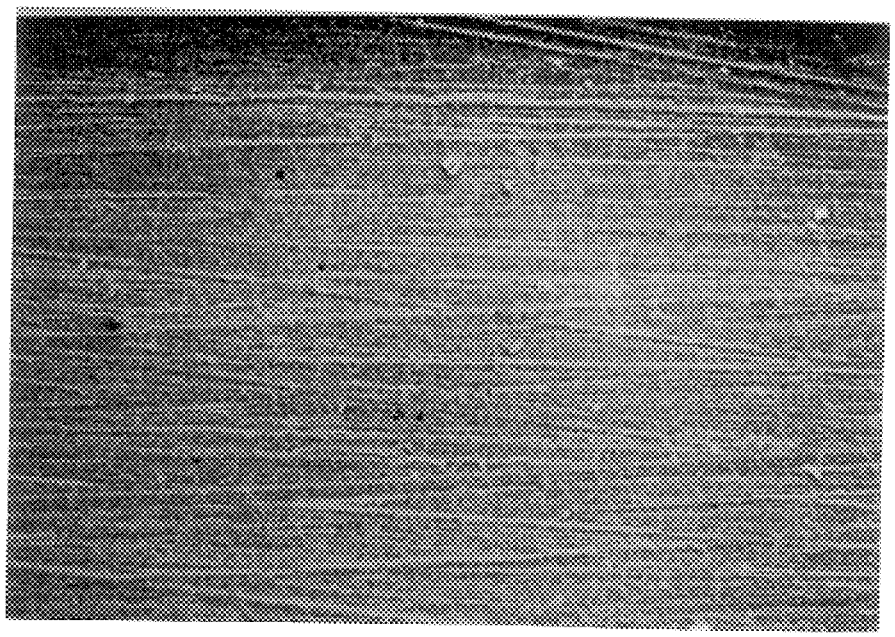

FIGS. 15a and 15b are pictures taken by a scanning electron microscope, after adhesion tests are performed by means of an adhesive tape, which is known by the trademark of Scotch Tape manufactured by the company of 3M on the market, on test pieces respectively after and before the plasma etching is performed, after copper films are coated on the test pieces. As shown in FIG. 15a, the copper films coated on the coating objects that are not subjected to an etching treatment are easily separated by the adhesive tape. On the contrary, FIG. 15b shows that the copper films coated after the etching treatment have strong adhesion forces. In the test, the copper films have exhibited superior adhesion forces which they are not separated by the adhesive tape even after being subjected to heat for two hours in boiling water.

Figure 16A:
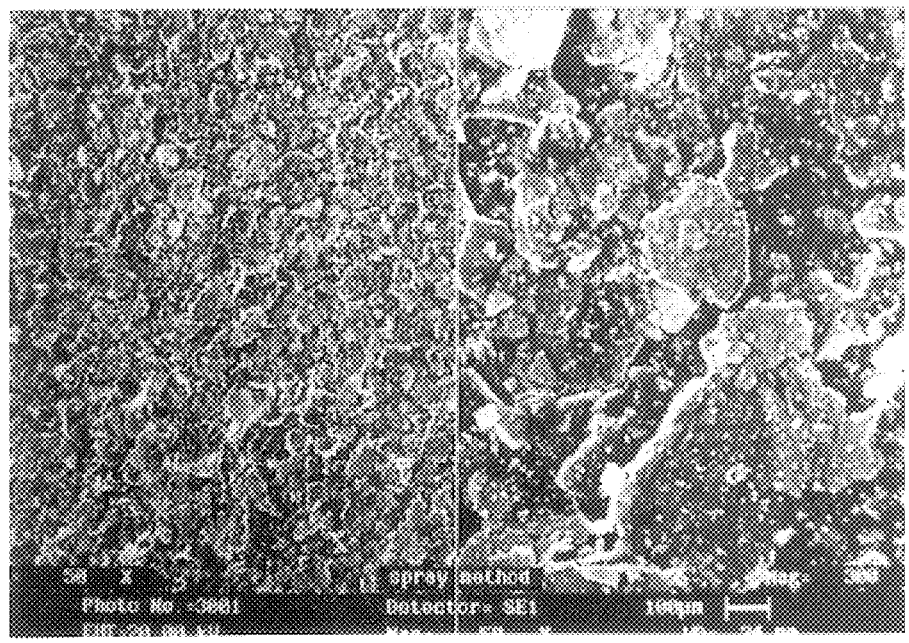
FIGS. 16a, 16b, 16c, and 16d are pictures taken by a scanning electron microscope, respectively when an electromagnetic wave shielding film is formed by the conventional spray method and by a method of the present invention.
Figure 16B:
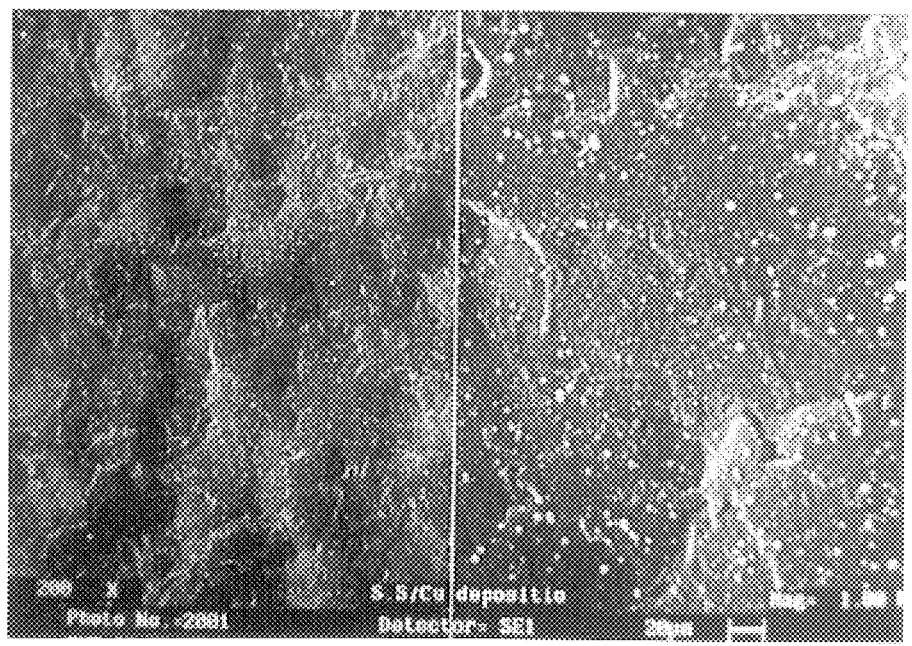

FIGS. 16a, 16b, 16c and 16d show pictures taken by a scanning electron microscope, respectively when an electromagnetic wave shielding film is formed by the conventional spray method and by a method of the present invention. That is, FIG. 16a is a picture for showing the surface of the electromagnetic wave shielding film formed by the conventional method, in which the coating particles coated on the film are coarse, not delicate, and relatively large, and a large portion of the coating object is exposed out of the coated film. On the contrary, in the electromagnetic wave shielding film formed by the method of the present invention as shown in FIG. 16b, the coating particles are fine and delicate, and the coated surface has a good flatness.

Figure 16C:
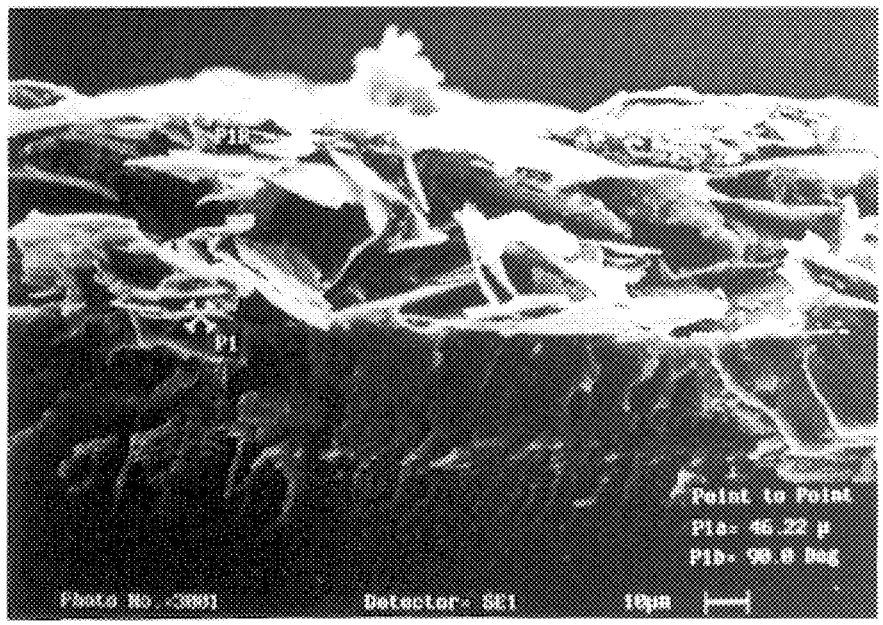
Figure 16D:
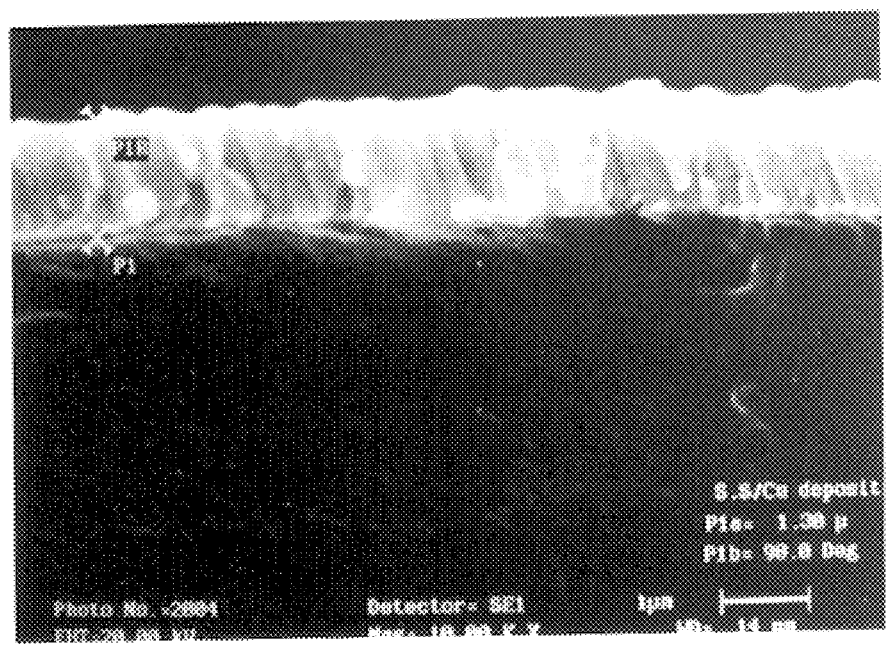

Further, in the electromagnetic wave shielding film formed by the method of the present invention as shown in FIG. 16c, the section of the electromagnetic wave shielding film is not delicate, the coating object and the coated film are spaced apart so as to decrease the adhesion force, and the thickness of the film is a relatively thick film of about 40 micrometers. On the contrary, in the electromagnetic wave shielding film formed by the method of the present invention as shown in FIG. 16d, the section of the electromagnetic wave shielding film is relatively delicate, the coating object and the coated film are in close contact with each other so as to have a good adhesion force, and the thickness of the film is a relatively thin film of about 1.3 micrometers.

Figure 17B:
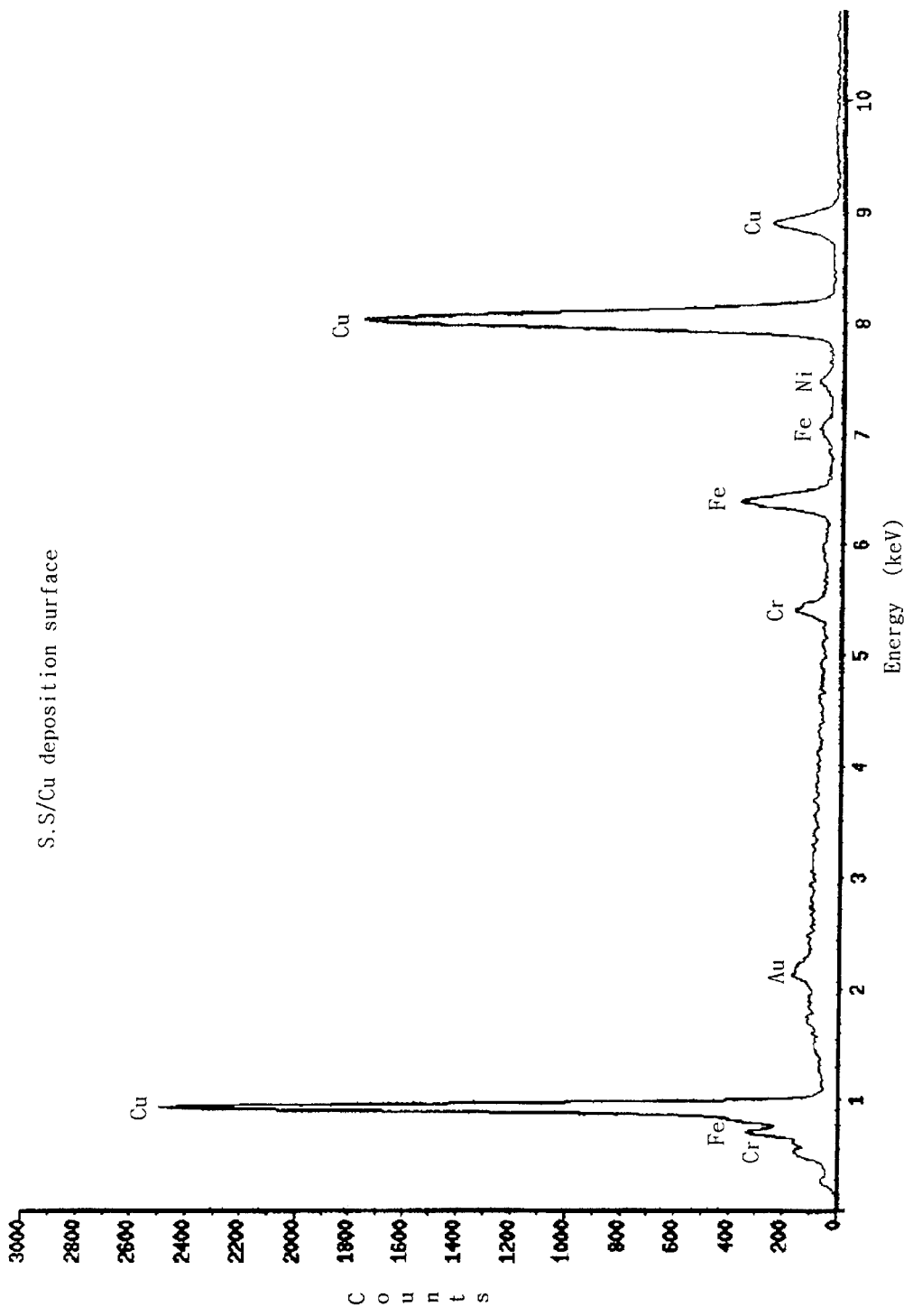

FIGS. 17a and 17b are graphs for showing the analyses of the constituents by an energy dispersive X-ray spectrometer (EDS), respectively of the conventional electromagnetic wave shielding film and the electromagnetic wave shielding film of the present invention. As shown in FIG. 17a, the conventional electromagnetic wave shielding film consists mainly of copper and silver. Moreover, in the conventional film, there exist constituents of the exposed coating object because the film is not delicate and uniform, and there exist carbon and oxygen that are impurities generated when the coating objects are spray-coated.

However, in the electromagnetic wave shielding film of the present invention as shown in FIG. 17b, there exist constituents of copper and stainless steel, and there do not exist an exposed portion of the coating object nor impurities because the coated film is delicate and uniform.

Figure 18A:
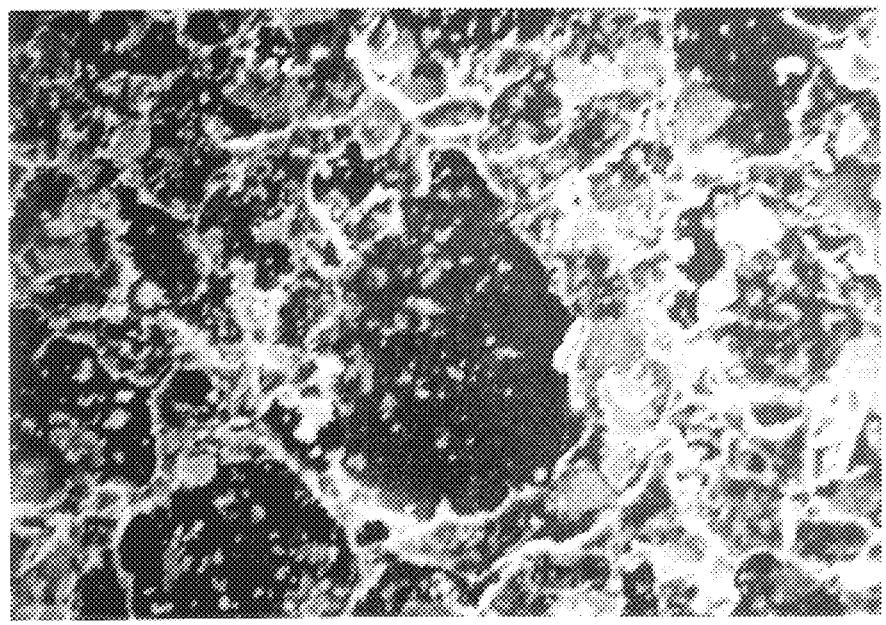
FIGS. 18a and 18b are photographs of the electromagnetic wave shielding film formed respectively by the conventional method and the method of the present invention, taken by a scanning electron microscope, after an adhesive tape is adhered to and detached from the film one time for each.
Figure 18B:
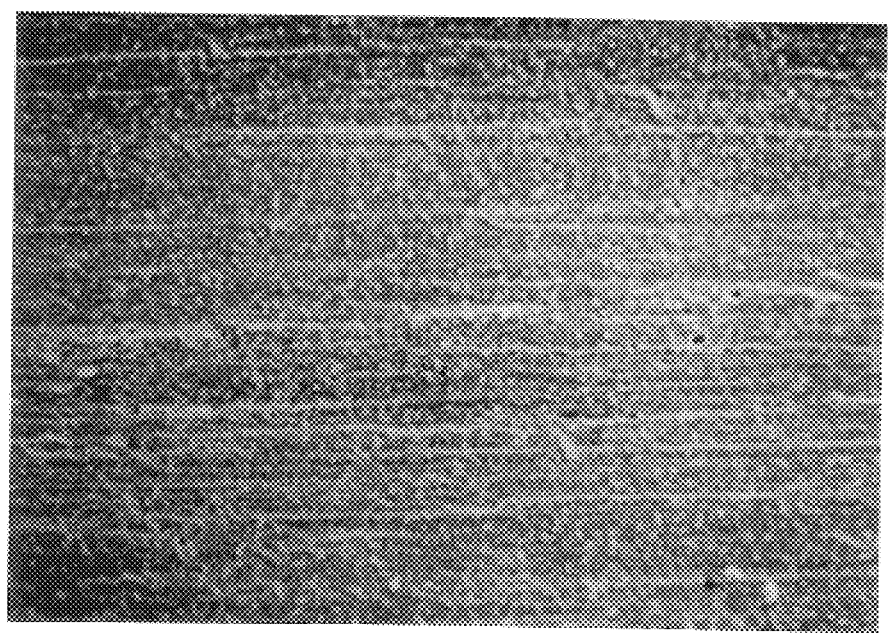

FIGS. 18a and 18b are photographs of the electromagnetic wave shielding film formed respectively by the conventional method and the method of the present invention, taken by a scanning electron microscope, after an adhesive tape is adhered to and detached from the film one time for each. As shown in FIG. 18a, a part of the surface of the coated film formed by the conventional method is stuck to the adhesive tape and separated from the coated film. On the contrary, FIG. 18b shows that the surface of the coated film formed by the method of the present invention is maintained the same before and after an adhesive tape is adhered to and detached from the film. Therefore, the electromagnetic wave shielding film formed by the method of the present invention has a superior adhesion force to that of the conventional electromagnetic wave shielding film.

Figure 19:
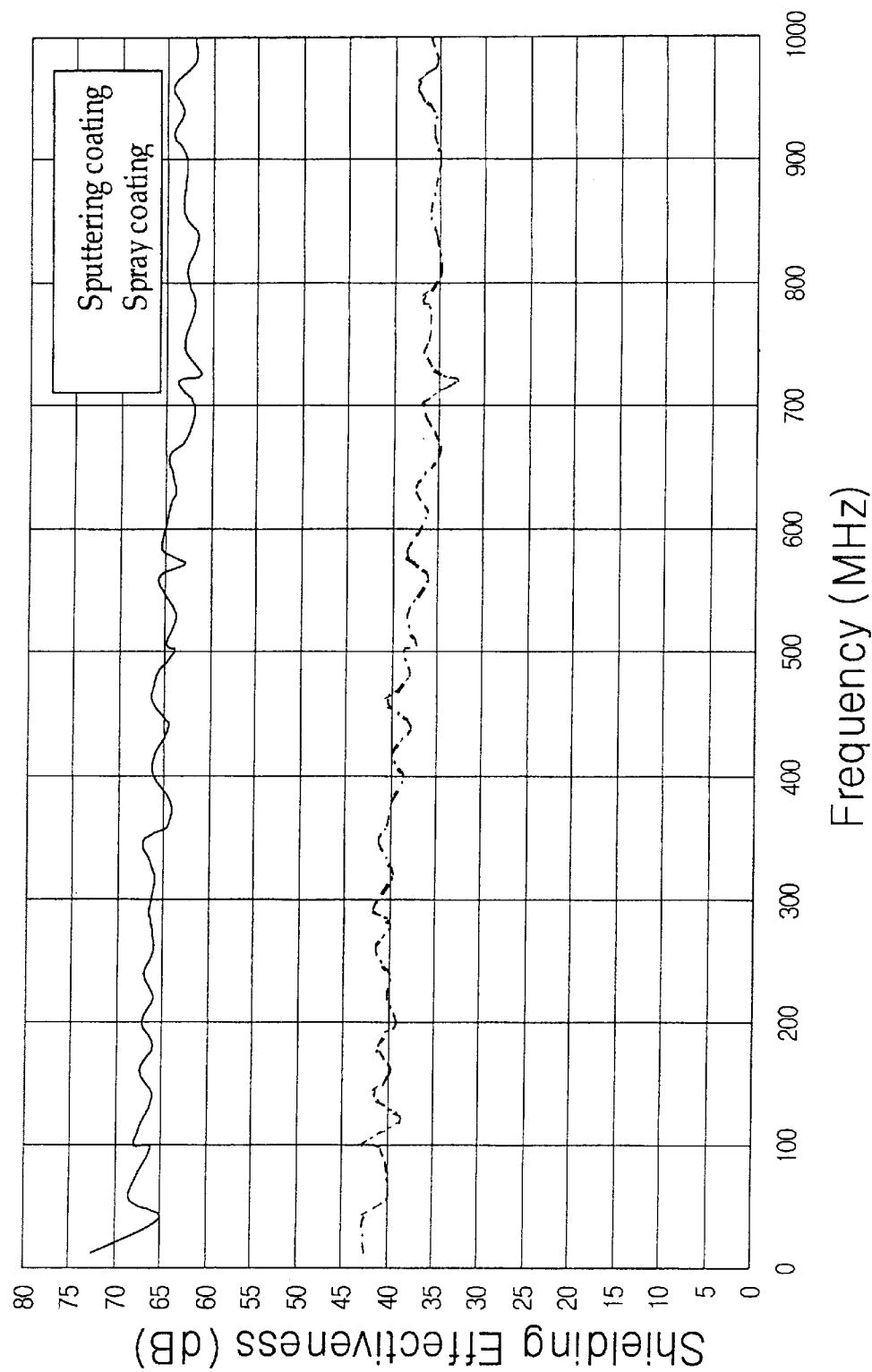
FIG. 19 is a graph for comparing the electromagnetic wave shielding effects by the films formed respectively by the conventional spray method and by the method and the apparatus of the present invention.

FIG. 19 is a graph for comparing the electromagnetic wave shielding effects by the films formed respectively by the conventional spray method and by the method and the apparatus of the present invention, on the basis of a reference by the American Society of Testing and Material (ASTM). That is, the conventional electromagnetic wave shielding film has an effect of 43 to 33 dB at a thickness of 40 micrometers, while the electromagnetic wave shielding film of the present invention has an effect of 70 to 62 dB at a thickness of 1.3 micrometers. Therefore, the electromagnetic wave shielding film of the present invention has an effect superior to that of the conventional electromagnetic wave shielding film.

The techniques as described above can be utilized, not only between plastic coating object and metal coating material, and between ceramic coating object and metal coating material, but also for micro-sized electronic components. Also, since the coatings in the steps as described above are performed as dry coatings by means of the plasma technique and the sputtering technique in separate spaces, they cause no pollution problems differently from the electroless plating and the spray coating.

Further, since the copper film and the stainless film are formed uniformly and delicately by the sputtering and the rotating of the jig, the present invention overcomes a problem of the relatively inferior shielding effect due to the non-uniform and indelicate coating at the edges of the coating object in the conventional electromagnetic wave shielding film. The thickness of the coated film and the uniformity of resistance factors can be maintained in a range of ±2% by a sputter cathode of large area, uniformly disposed gas holes, near disposition of targets and coating objects and rotation of the jig, and the resistance of the conductive coated film can be minutely regulated by regulating the thickness of the coated film.

Further, the electromagnetic wave shielding film formed by the method of the present invention employs dually-coated films of the copper film and the stainless steel film having a superior electromagnetic wave shielding characteristic respectively at ranges of low frequency and high frequency of the electromagnetic wave. Therefore, the electromagnetic wave shielding film has a stable and superior electromagnetic wave shielding effect at a broad range of frequency.

In a description of detailed dimensions in order to maximize the productivity, the chamber may have a diameter of about 1200 mm and a length of about 1500 mm, and the rotating jig may have a diameter of about 700 mm and a length of about 1300 mm. These dimensions described above as an example are the maximum dimensions for containing the coating objects as most as possible. In this case, regardless of the sizes and the shapes of the conductive and insulating materials, a large quantity of coating objects can be loaded, and the time for pumping the remaining gas can be reduced by means of a large-sized high-speed pumping apparatus. Moreover, since alien materials existing in the apparatus and parting compounds of the injection molding are eliminated by the etching treatment, a most proper coating condition is arranged.

Further, according to the present invention, since strong magnets are disposed at the rear surfaces of the targets, the sputtering yield, which means the quantity of the atoms dispersed and arrived at the product after being sputtered at the targets, is increased. Also, the magnetic field applied to the targets is arranged adjacent and in parallel to the coating objects, so that it takes a reduced time for the ionized atoms to reach the coating objects. Moreover, since the deposition is possible at a broad area, mass-production of the products is possible by high-speed formation of the film according to the increase of the ionizing rate.

Further, cooling water can be circulated at the rear surfaces of the targets, so as to prevent the magnets from deforming and aging, thereby prolonging the lives of the magnets.

In a viewpoint of reproductivity, the electromagnetic wave shielding film coating apparatus is excellent, since the entire process is automated, the electric power and the quantity of gas can be regulated, and the rotating speed of the jig can be regulated, in the apparatus. In an economic point of view, since the apparatus of the present invention has the same speed of forming the film as that of the an in-line sputter system having a length of 25 mm when the rotating jig rotates ten revolutions, the apparatus of the present invention requires a considerably reduced manufacturing cost in comparison with the in-line sputter system having a length of 25 mm.

Meanwhile, the present invention may also employ objects made from ceramic, resin, or fiber, or micro-sized electronic components and so on, as the coating objects, although the description has been given based on that the coating objects are made by the injection-molding polycarbonate in the previous embodiments.

Also, although a copper film and a stainless steel film are sequentially coated on the coating objects after the coating objects are plasma-etched in the previous embodiments, the copper film may be replaced by a copper oxide film, an aluminum film and an aluminum oxide film, and the stainless steel film may be replaced by a metal film such as a silver film.

Further, although the coating objects are plasma-etched after being cleaned by ultrasonic wave and being dried by hot wind in an oven in the previous embodiments, the plasma etching may be performed successively after performing a sputter etching and a physical etching on the coating surfaces of the coating objects.

Furthermore, although oxygen gas is injected as a reactive gas into the plasma-etching chamber when the plasma etching is performed in the previous embodiments, an inert gas or another reactive gas except for the oxygen gas may be injected into the chamber. The inert gas may be argon gas or helium gas, and the reactive gas may be $H_2$ gas, $N_2$ gas, $CF_4$ gas, $NH_4$ gas, $O_2$ gas, and gas of mixture thereof.

In the apparatus and the method for coating electromagnetic wave shielding films according to the present invention as described above, the adhesion force between the coating objects and the coating material is strengthened and the coated film is more delicate in comparison with the prior art, and the coated electromagnetic wave shielding film has a uniform thickness and uniform constituents. Further, a uniform coating is possible regardless of the shapes of the coating objects, and there remains no impurity in the coated film after the coating treatment is performed. In addition, since the electromagnetic wave shielding film formed according to the method and the apparatus of the present invention as described above is a dual-film consisting of a copper film and a stainless steel film, the film has a stable and superior electromagnetic shielding effect at a broad range of frequency. Additionally, the stainless steel film functions as a protect layer for preventing the surface from being damaged.

While there have been illustrated and described what are considered to be preferred specific embodiments of the present invention, it will be understood by those skilled in the art that the present invention is not limited to the specific embodiments thereof, and various changes and modifications and equivalents may be substituted for elements thereof without departing from the true scope of the present invention.

What is claimed is:

1. An apparatus for coating electromagnetic wave shielding films, the apparatus comprising:

a cylindrical chamber having a door at a front face of the chamber and a plurality of pumps disposed at both sides of the chamber;

a cylindrical rotating jig disposed in the chamber, the rotating jig having a plurality of coating objects loaded in the rotating jig;

means for rotating the rotating jig at a predetermined speed, said rotating means being disposed at a back side of the rotating jig;

means for moving the rotating jig to be put into and drawn out of the chamber so as to load and unload the coating objects in and out of the rotating jig, said moving means being disposed under the rotating jig;

targets disposed inside and outside of the rotating jig, the targets functioning as cathodes; and a controller for controlling operation of the apparatus, the controller being disposed at one side of the chamber;

wherein the rotating jig has a shape of a circular ring, and comprises a pair of fixing plates spaced apart from each other, a plurality of fixing members disposed between the fixing plates, and a plurality of clamping means for fixing the coating objects, the clamping means being disposed outside of the fixing members; and wherein each of the clamping means comprises a moving clamp disposed outside of each of the fixing members, a bolt extending through said each of the fixing members and the moving clamp, and a tightening screw assembled with the bolt so as to tighten and loosen the moving clamp.

2. An apparatus as claimed in claim 1, wherein the jig rotating means comprises a motor disposed outside of the chamber, a driving gear rotatably disposed in the chamber and connected to a motor shaft of the motor, and a driven gear engaged with the driving gear, the driven gear having a shape of an annulus whose inner circumference is supported by supporting rollers.

3. An apparatus as claimed in claim 2, wherein the driven gear has a driving-side protuberance disposed at a portion of the driven gear, and the fixing plate of the rotating jig has a jig-side protuberance disposed at the fixing plate, the jig-side protuberance being engaged with the driving-side protuberance when the driven gear rotates.

4. An apparatus for coating electromagnetic wave shielding films, the apparatus comprising:

a cylindrical chamber having a door at a front face of the chamber and a plurality of pumps disposed at both sides of the chamber;

a cylindrical rotating jig disposed in the chamber, the rotating jig having a plurality of coating objects loaded in the rotating jig;

means for rotating the rotating jig at a predetermined speed, said rotating means being disposed at a back side of the rotating jig;

means for moving the rotating jig to be put into and drawn out of the chamber so as to load and unload the coating objects in and out of the rotating jig, said moving means being disposed under the rotating jig;

targets disposed inside and outside of the rotating jig, the targets functioning as cathodes; and a controller for controlling operation of the apparatus, the controller being disposed at one side of the chamber;

wherein the jig moving means comprises a pair of semi-circular jig supporters disposed at a lower portion of the rotating jig and spaced from each other, a pair of crossbeams connecting the jig supporters, a plurality of rollers disposed with predetermined intervals apart at the crossbeams, and a pair of rails disposed at both sides in the chamber, along which the rollers can roll.

5. An apparatus as claimed in claim 1 or claim 4, wherein the targets have a plurality of bar magnets arranged at the rear surfaces of the targets, the apparatus further comprising a holder for fixing the targets and the bar magnets, the holder having cooling water circulating holes formed in the holder.

* * * * *